United States Patent [19]

Glover et al.

[11] Patent Number: 4,613,949
[45] Date of Patent: Sep. 23, 1986

[54] COMPOSITE PULSES FOR TIME REVERSAL IN NMR IMAGING

[75] Inventors: Gary H. Glover, Waukesha, Wis.; Matthew O'Donnell, Schenectady, N.Y.

[73] Assignee: General Electric Company, Schenectady, N.Y.

[21] Appl. No.: 581,150

[22] Filed: Feb. 17, 1984

[51] Int. Cl.⁴ .................... G06F 15/52; G06F 15/42
[52] U.S. Cl. .................... 364/527; 324/307; 324/309; 364/576; 364/414
[58] Field of Search ............... 364/527, 485, 576, 414; 324/307, 309, 311, 312, 314

[56] References Cited

U.S. PATENT DOCUMENTS

| 3,968,424 | 7/1976 | Ernst | 324/312 X |
|---|---|---|---|
| 4,065,714 | 12/1977 | Hill | 324/312 X |
| 4,238,735 | 12/1980 | Muller | 324/314 X |
| 4,438,400 | 3/1984 | Patt | 324/307 X |
| 4,443,760 | 4/1984 | Edelstein et al. | 324/314 X |
| 4,443,761 | 4/1984 | Levitt | 324/311 |
| 4,470,014 | 9/1984 | Levitt et al. | 324/307 X |
| 4,471,305 | 9/1984 | Crooks et al. | 324/314 X |
| 4,472,683 | 9/1984 | Sekihara et al. | 324/307 X |
| 4,502,008 | 2/1985 | Ohuchi | 324/307 X |
| 4,520,315 | 5/1985 | Loeffler et al. | 324/309 |
| 4,543,529 | 9/1985 | Mee et al. | 324/314 X |

OTHER PUBLICATIONS

Journal Magnetic Resonance, 1980, "Radiofrequency Pulse Sequences Which Compensate Their Own Imperfections", Freeman et al, pp. 453–479.
J. Magnetic Resonance, 1981, "Compensation for Pulse Imperfections in NMR Spin Echo Experiments", Levitt et al, pp. 65–80.
J. Magnetic Resonance, 1982, "Symetrical Composite Pulse Sequences for NMR Population Inversion I ... ", Levitt, pp. 234–264.
J. Magnetic Resonance, 1982, "Symetrical Composite Pulse Sequences for NMR Population Inversion II ... ", Levitt, pp. 95–110.

Primary Examiner—Errol A. Krass
Assistant Examiner—Kevin J. Teska
Attorney, Agent, or Firm—Geoffrey H. Krauss; James C. Davis, Jr.; Marvin Snyder

[57] ABSTRACT

Composite pulses are employed in NMR imaging for time-reversal of nuclear spins in a transverse planar region of a sample to produce spin-echo signals. The composite pulses comprise a sequence of pulses for producing a 90° rotation of the spins about a first transverse axis, a 180° rotation of the spins about a substantially orthogonal transverse axis, and a 90° rotation of the nuclear spins about the first transverse axis. The composite pulses minimize time-reversal errors caused by static magnetic field and RF field inhomogeneities, and afford multiple spin-echo NMR imaging sequences.

19 Claims, 15 Drawing Figures

COMPOSITE PULSES FOR TIME REVERSAL IN NMR IMAGING

BACKGROUND OF THE INVENTION

This invention relates generally to NMR imaging and, more particularly, to NMR imaging employing pulses for time-reversal of nuclear spins to produce spin-echo signals.

Static main magnetic field and RF magnetic field inhomogeneities, i.e., spatial variations in the magnetic field, are a significant problem in NMR imaging, particularly in spin-echo NMR imaging where 180° RF pulses are employed for time-reversing nuclear spins in a plane transverse to the static main magnetic field to produce spin-echo signals. In spin-echo imaging, nuclear spins in a selected region of a sample are nutated away from their alignment with the main magnetic field into a transverse plane by applying to the sample a 90° RF pulse along an axis that is substantially orthogonal to the main magnetic field. Upon being nutated to the transverse plane, the nuclear spins begin to precess in phase in the transverse plane, at the characteristic NMR frequency, $\omega$, given by the Larmor equation:

$$\omega = \gamma \beta \tag{1}$$

where $\gamma$ is the gyromagnetic ratio, which is constant for a particular nuclear species, and $\beta$ is the magnetic field to which the nuclear spins are subjected. However, the nuclear spins quickly lose phase coherence due to local field inhomogeneities and begin to dephase. A 180° RF pulse is then applied to the sample to time-reverse the nuclear spins in the transverse plane, which reverses the net transverse magnetization. Although the resonant, i.e., precession, frequency of the nuclear spins remains the same, the 180° pulse shifts their relative phase by 180° so that the NMR signals produced by the nuclear spins rephase as the nuclear spins regain phase coherence and produce a spin-echo signal. Inhomogeneities in either or both of the main magnetic field and the RF field may prevent the nuclear spins from all being properly time-reversed. Accordingly, instead of all of the nuclear spins regaining phase coherence at the same time, they rephase at different times and produce destructive interference which reduces the amplitude of the desired spin-echo signal.

The two principal sources of magnetic field inhomogeneity are (1) variations in the static main magnetic field due to practical difficulties in constructing magnets capable of producing a perfectly homogeneous field across a sample, and (2) variations in the RF magnetic field due to practical difficulties in constructing RF coils that are capable of producing a perfectly homogeneous RF magnetic field across the sample. As the magnetic field inhomogeneity increases relative to the time-reversing RF magnetic field, the error in rephasing the time-reversed nuclear spins increases. In multiple echo experiments, wherein a plurality of successive 180° pulses are applied to a sample to generate successive spin-echo signals, the errors can produce artifacts in the resulting NMR image and render the image unusable.

Prior attempts to minimize such errors have included the use of an RF field having as large a magnitude as possible, so as to minimize the magnitude of the inhomogeneities relative to the RF field. The difficulty with this approach, particularly when using large static main magnetic fields as is desirable in NMR imaging, is that high-magnitude RF fields can burn a patient and can interfere with metabolic processes in the body. Moreover, as the RF field magnitude is increased, the associated hardware for generating the RF field increases in cost and complexity.

Magnetic field inhomogeneities are not as significant a problem in NMR spectroscopy, wherein the NMR signals from a plurality of different nuclear spins are detected from the whole of a sample in order to analyze the chemical structure of a sample of much smaller sample sizes than are employed in whole body NMR imaging, where sample sizes are comparable to the cross-sectional dimensions of the human body. However, difficulties have been encountered in NMR spectroscopy in producing predetermined rotations of the different nuclear spins in a sample, in part because of the relatively large resonant offsets between the different nuclear species. Recently, it has been proposed to employ composite pulses, comprising sequences of RF pulses for inversion recovery experiments in NMR spectroscopy, as a way of minimizing systematic errors in spin-lattice relaxation time determinations. (See Freeman et al., "Radiofrequency Pulse Sequences Which Compensate Their Own Imperfections", *Journal of Magnetic Resonance*, Vol. 38, pp. 453–479, 1980.) Composite 180° pulses comprising a pulse for producing a 90° rotation about one axis, a 180° rotation about an orthogonal axis, and a 90° rotation about the first axis have also been investigated in connection with spin-echo experiments in NMR spectroscopy. (See Levitt et al., "Compensation For Pulse Imperfections in NMR Spin-Echo Experiments", *Journal of Magnetic Resonance*, Vol. 43, pp. 65–80, 1981.) Although such composite pulses have been shown to be capable of minimizing systematic errors and of producing an NMR signal having an amplitude that is substantially preserved, an unfortunate consequence of employing composite pulses for nuclear spin rotations in a transverse plane is that the composite pulses introduce a phase error that varies as a function of the RF and main magnetic field inhomogeneities. Since the inhomogeneities vary spatially throughout the sample, then the phase errors will also spatially vary throughout the sample. If the signals produced by nuclear spins at two different points in a sample happen to have a 180° phase difference, then the signals cancel each other and it appears as if output signals from those points are not produced. Accordingly, composite pulses find applicability in NMR spin-echo spectroscopy only when the magnetic field inhomogeneity is either small or very well defined and the only significant inhomogeneity in the sample is that due to the chemical shift between the different nuclear spins.

In NMR imaging, where the magnetic field inhomogeneities are in general undefined and where rather large sample sizes are employed, rather large undefined phase errors can be encountered using composite pulses, and composite pulses have not been heretofore considered for overcoming time-reversal errors due to magnetic field inhomogeneities.

SUMMARY OF THE INVENTION

In accordance with the invention, composite pulses are utilized for time-reversal of nuclear spins in spin-echo NMR imaging to reduce the errors associated with magnetic field inhomogeneities. This is accomplished, in one aspect, by applying to a sample, as part of an NMR imaging sequence, a composite pulse to time-reverse nuclear spins in a selected transverse planar region of the sample; the composite pulse comprises a sequence of pulses for producing a plurality of rotations of the nuclear spins about orthogonal axes in the transverse planar region. The method also comprises detecting the resulting spin-echo NMR signals produced by nuclear spins at a plurality of different locations in the selected region; processing the spin-echo signals to produce complex signals; and forming an NMR image using the magnitudes of the complex signals.

Preferably, the composite pulse comprises three pulse sequences: a first pulse for producing a first rotation of nuclear spins about a first axis in a transverse plane of the sample at a selected region of the sample; a second pulse, following the first pulse, for producing a second rotation of the nuclear spins about a second axis also in the transverse plane and substantially orthogonal to the first axis; and a third pulse, following the second pulse, for producing a third rotation of the spins about the first axis.

In accordance with another aspect, the invention utilizes NMR imaging apparatus having an RF pulse generating means for producing a composite RF pulse for time-reversing nuclear spins. The RF pulse generating means comprises: an RF source for generating an RF carrier having a predetermined frequency; means connected to the RF source for producing in-phase and quadrature-phase components of the RF carrier; and means receiving the in-phase and quadrature-phase components for providing a composite RF pulse comprising a sequence of the in-phase and quadrature-phase components selected to produce, in a selected region of the sample, sequentially a first rotation of the nuclear spins about a first transverse axis, a second rotation of the spins about a second transverse axis substantially orthogonal to the first transverse axis, and a third rotation of the spins about the first transverse axis so as to time-reverse the nuclear spins; and means for applying the composite pulse to the sample.

BRIEF DESCRIPTION OF THE PREFERRED EMBODIMENT

The invention is particularly well adapted for use in multiple echo NMR imaging for successively time-reversing nuclear spins in a transverse plane in order to generate multiple spin-echoes, and will be described in that environment. However, as will be appreciated, this is illustrative of only one utility of the invention.

Figure 1:
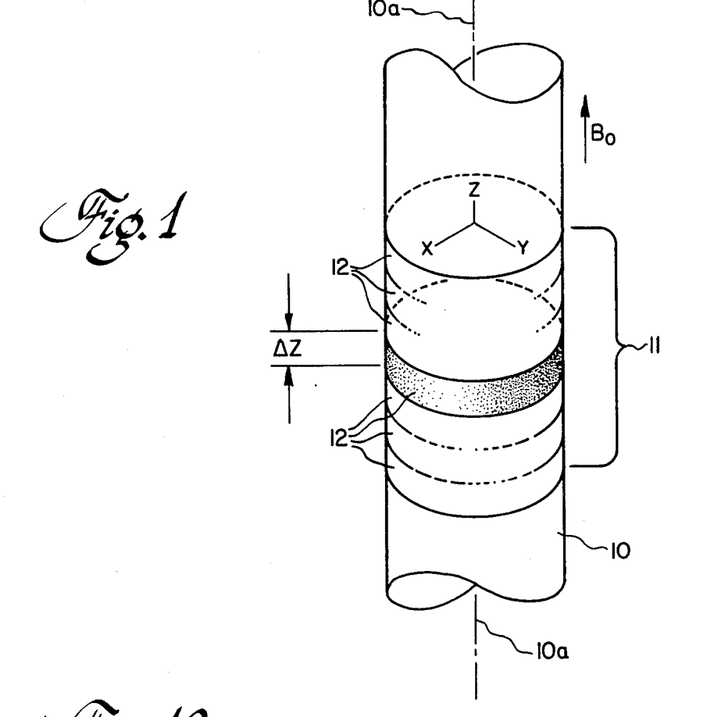
FIG. 1 is a diagrammatic view of an NMR imaging sample situated in a static magnetic field and having an imaging volume defined therein.

FIG. 1 illustrates an NMR sample 10, which may be cylindrically shaped, for example, positioned in a static main magnetic field $B_o$ directed along the positive z-axis direction of a conventional Cartesian coordinate system, the z-axis being selected to be coincident with the axis 10a of the sample. The origin of the coordinate system may be taken to be the center of a thick imaging volume 11 defined by selective excitation of the nuclear spins within the imaging volume. A plurality of NMR images, each corresponding to one of a plurality of planar slices 12 of thickness $\Delta z$ of the imaging volume, may be obtained upon analysis of the NMR signals produced by the nuclear spins within the imaging volume.

As is well known, the effect of the static magnetic field $B_o$ is to cause nuclear spins within the sample to align themselves with the $B_o$ field and to produce a net magnetization in the z-axis direction. If a magnetic field gradient $G_z$ which varies spatially along the z-axis is superimposed upon the $B_o$ field, the nuclear spins within the sample will be subjected to a magnetic field that varies as a function of position along the z-axis and, accordingly, as shown by Equation 1, the resonant frequency of the nuclear spins will vary spatially in a similar manner. By applying to the sample, in a direction substantially orthogonal to the main magnetic field (i.e. substantially in the x-y plane), an RF pulse having frequency components corresponding to the resonant frequencies of the nuclear spins within a desired imaging volume 12, the nuclear spins within that imaging volume can be selectively excited and nutated into the transverse x-y plane. Such an RF pulse is referred to as a 90° selective pulse. As previously indicated, after being nutated to the transverse plane, the nuclear spins initially begin to precess in phase but quickly lose phase coherence because of local magnetic field inhomogeneities. In spin-echo NMR imaging, a 180° pulse is applied to the sample as part of the NMR imaging sequence, which also includes time varying gradient fields $G_x$ and $G_y$ for spatially encoding the nuclear spins. The 180° pulse time-reverses the dephasing nuclear spins in the transverse plane to cause the spins to rephase and produce a spin-echo signal. The spin-echo signal may be Fourier-transformed to derive its frequency components, which are representative of the distribution of nuclear spins in the imaging volume 12. As previously noted, however, static magnetic field and RF field inhomogeneities prevent all of the nuclear spins from being properly time-reversed, which causes a reduction in the amplitude of the desired spin-echo signal and can produce artifacts in the resulting NMR image.

In accordance with the invention, the normal 180° time-reversing pulse of the NMR imaging sequence is replaced by a composite pulse comprising a sequence of pulses which produce predetermined rotations of the nuclear spins about one or the other of the x-axis and the y-axis of the transverse plane. The rotations are selected to produce an overall time-reversal of the nuclear spins. The composite pulse may comprise, for example, a 90° pulse for rotating the nuclear spins 90° about a first axis, e.g. the x-axis, in the transverse plane, followed immediately by a 180° pulse for rotating the nuclear spins 180° about an orthogonal transverse axis, i.e. the y-axis, and, finally, another 90° pulse for producing a 90° rotation of the nuclear spins about the first axis, e.g. the x-axis. The composite pulse may be represented by the pulse sequence $90_x$-$180_y$-$90_x$. Although the composite pulse is twice as long as a normal 180° pulse, as will be pointed out hereinafter, the composite pulse is significantly less sensitive than a normal 180° pulse to static magnetic field and RF field inhomogeneities. Accordingly, time-reversal errors are substantially reduced and the amplitude of the spin-echo signal is to a large extent preserved. Advantageously, this allows imaging sequences to have multiple successive time-reversing pulses for generating multiple spin-echo response signals, which improves the accuracy in $T_2$ spin-spin relaxation time determinations.

Figure 2:
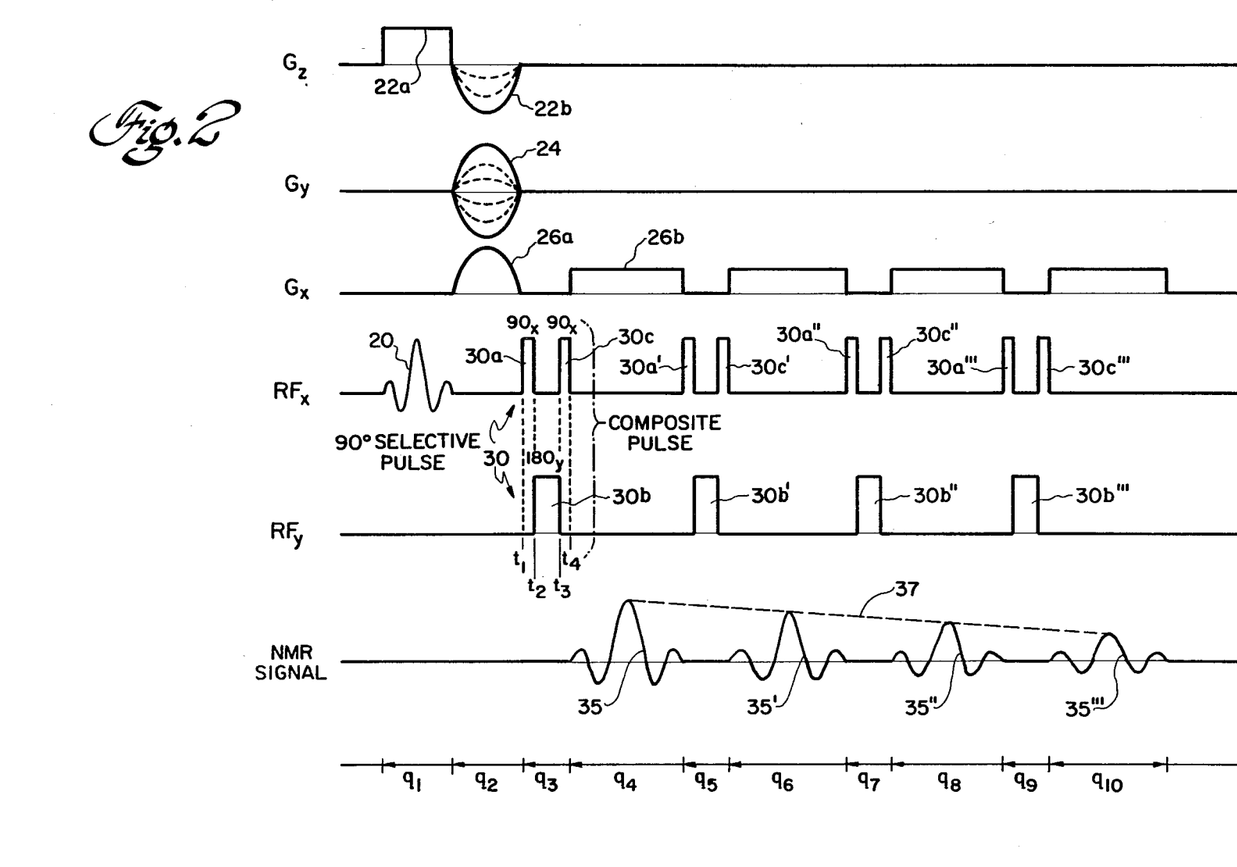
FIG. 2 is a diagrammatic view illustrating a three-dimensional multiple echo NMR imaging sequence employing a composite pulse for time-reversal.

FIG. 2 illustrates a three-dimensional multiple echo NMR imaging sequence employing a composite 180° pulse for time-reversal of nuclear spins. The imaging sequence illustrated in FIG. 2 is but one of many well-known spin-echo imaging sequences which may advantageously employ a composite pulse, and is merely presented herein for illustrative purposes.

Referring to FIG. 2, in a first time interval, $q_1$, a 90° selective RF pulse 20 is applied to the sample in the x-axis direction, in the presence of a positive $G_z$ gradient signal portion 22a, to excite selectively the nuclear spins in a desired imaging volume and to nutate the spins into the transverse x-y plane. As is well known, and as is illustrated in the figure, the 90° pulse 20 may be an RF carrier signal which is amplitude-modulated by a gating waveform, e.g. a (sin bt)/bt waveform, where b is a constant and t is time, such that the resulting gated RF pulse contains frequency components which excite nuclear spins in a substantially rectangular thickness profile of the imaging volume.

In time period $q_2$, a negative-polarity dephasing $G_z$ gradient signal portion 22b may be applied to the sample along with phase-encoding $G_y$ gradient signals portion 24 and $G_x$ gradient signal portion 26a.

In time period $q_3$, a composite 180° time-reversal pulse (generally indicated as pulses 30) is applied to the sample to produce a spin-echo NMR response signal 35 in time period $q_4$. The spin-echo NMR response signal 35 is detected in the presence of a $G_x$ gradient signal portion 26b.

As shown in FIG. 2, the composite pulse 30 comprises a pair of spaced 90° pulses 30a and 30c (each hereinafter designated as $90_x$) for producing 90° rotations of the nuclear spins about the x-axis, and a 180° pulse 30b (hereinafter designated at $180_y$) interposed between the two 90° pulses 30a and 30c for rotating the nuclear spins 180° about the y-axis. The pulses may be applied to the sample by switching an RF carrier between two substantially orthogonal RF coils, or preferably, as described hereinafter, by using a single RF coil and imposing a 90° phase shift between the $180_y$ pulse and each of the $90_x$ pulses. As shown, the $90_x$ pulses may have substantially the same amplitude as the $180_y$ pulse but have substantially one-half of the duration of the $180_y$ pulses. The composite pulses 30 illustrated in the figure are non-selective 180° pulses. If desired, however, selective 180° composite pulses may be employed, as described hereinafter, so as to produce time-reversal of nuclear spins only in thin planar slabs of the imaging volume.

As is shown in FIG. 2, successive composite pulses 30', 30" and 30"' may be respectively applied during time periods $q_5$, $q_7$ and $q_9$ to produce corresponding multiple spin-echo NMR response signals 35', 35" and 35"' during respective time periods $q_6$, $q_8$ and $q_{10}$. The exponential decay of the multiple spin-echo signals (indicated by the broken line 37) is related to the $T_2$ spin-spin relaxation time. The composite pulses 30-30"' minimize errors due to imperfect time-reversal of the nuclear spins and substantially preserve spin-echo signal amplitude. Thus, the use of composite pulses 30 enable a greater number of spin-echo signals 35 to be produced and afford a more accurate determination of $T_2$ than is possible using normal 180° pulses for the time-reversal function, where the errors associated with imperfect time-reversals of the spins cause a rapid loss of spin-echo signal amplitude. The effect of such errors, and the improved results afforded by employing composite pulses, can be seen by comparing FIGS. 3a–3b and FIGS. 4a–4b. These figures illustrate NMR images of a test sample produced from different spin-echo signals of a 4-echo multiple echo imaging sequence such as illustrated in FIG. 2, in a 0.15T NMR imaging system.

Figure 3A:
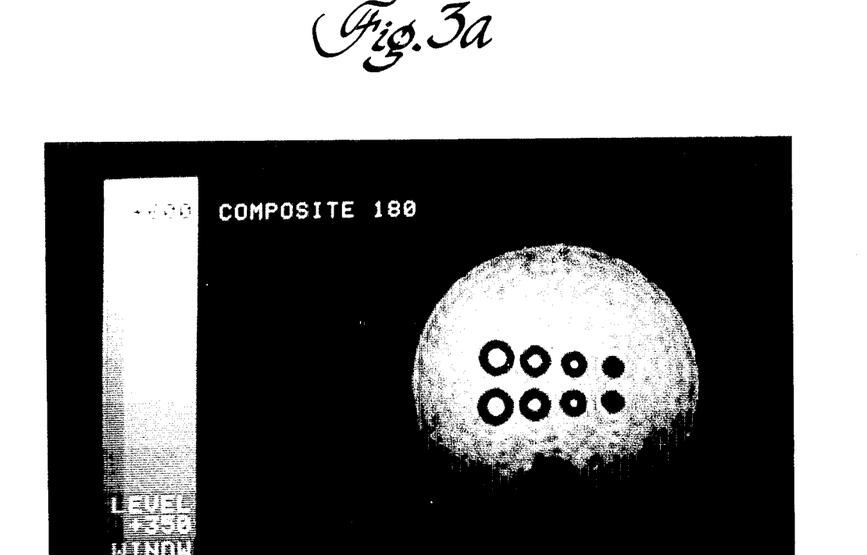
FIGS. 3a and 3b are photographs of the NMR images of a test sample obtained from the first echo of a four-echo multiple echo imaging sequence employing a composite pulse (FIG. 3a) and a normal pulse (FIG. 3b), respectively, for time-reversal.
Figure 3B:
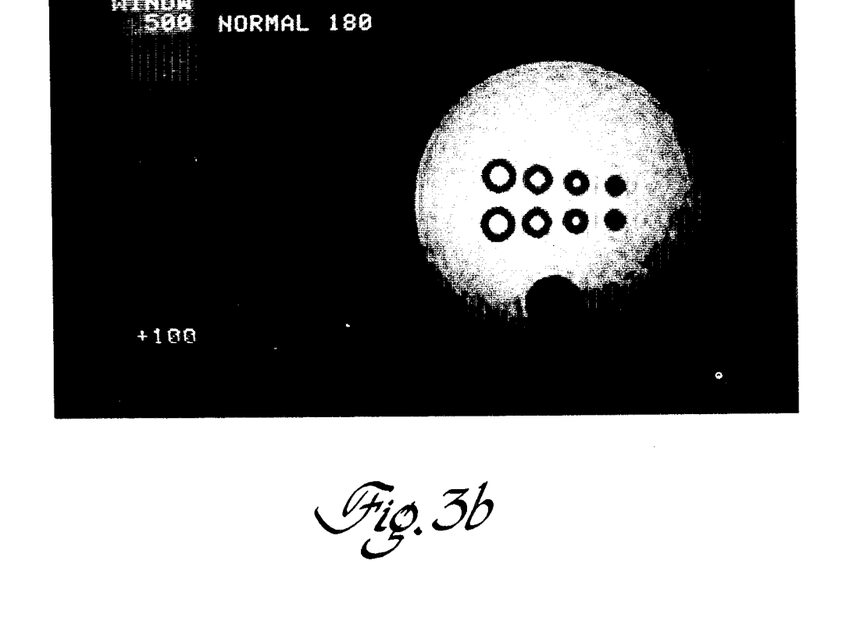
Figure 4A:
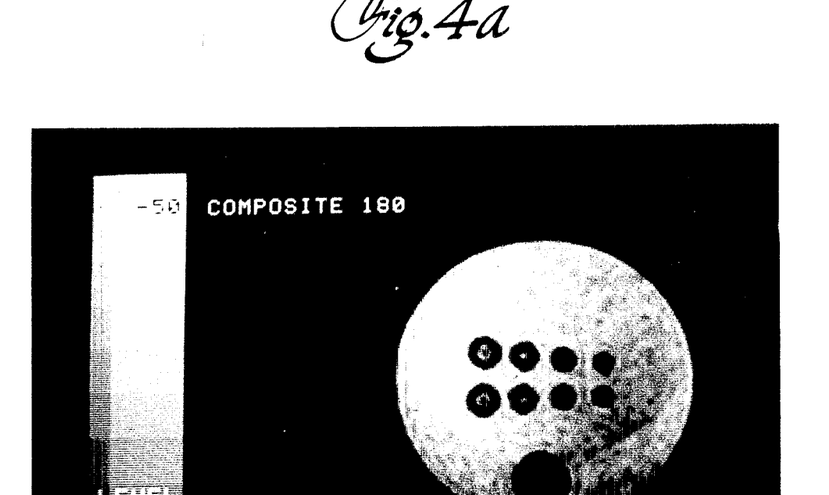
FIGS. 4a and 4b are photographs similar to FIGS. 3a and 3b, respectively, but illustrating the NMR images of the test sample obtained from the fourth echo of the imaging sequence.
Figure 4B:
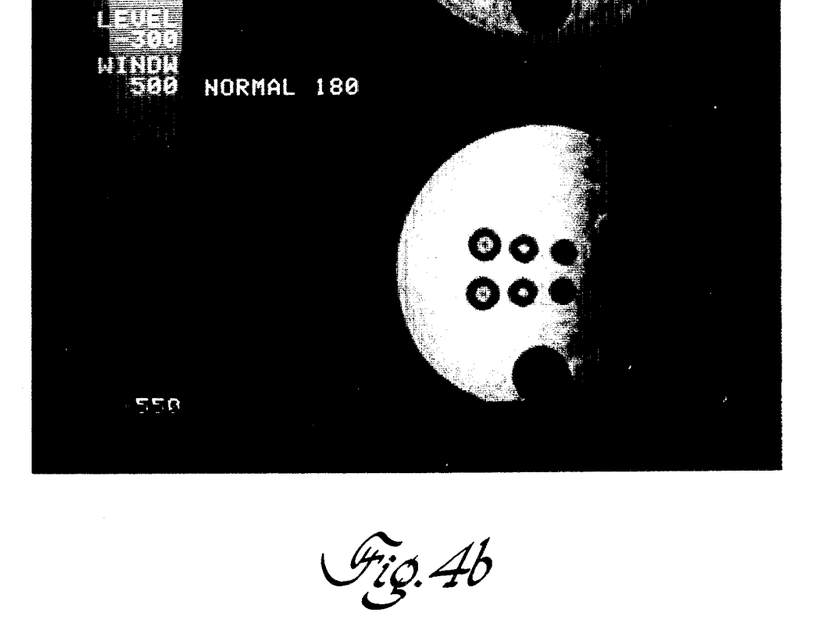

The images of FIGS. 3a and 3b were produced from the first echo of the sequence, while the images of FIGS. 4a and 4b were produced from the fourth echo of the sequence. The images of FIGS. 3a and 4a were made using normal pulses in the imaging sequence. FIGS. 3a and 3b do not show a significant difference between the images obtained with a composite pulse and a normal pulse from the first echo of the multiple echo sequence. However, FIGS. 4a and 4b show that, for the fourth echo of the sequence, there is a significant difference between the image (FIG. 4a) obtained using a composite pulse and the image (FIG. 4b) obtained using a normal pulse. As shown in FIG. 4b, the image obtained using a normal pulse has an artifact (the dark shadow at the right-hand side of the image), whereas FIG. 4a shows that the image obtained using a composite pulse does not.

The improved results obtained using a composite pulse are due to the fact that, with a composite pulse, time-reversal errors are second order errors, whereas with a normal pulse, they are first order errors. This may be demonstrated as follows: The rotation matrix for a simple, i.e., normal, 180° pulse is $$R = R_z(\Phi) R_y(\Theta) R_z(\Phi) \quad (2)$$

Where $R_z(\Phi)$ represents the precession due to field inhomogeneities, and $R_y(\Theta)$ represents the rotation due to the RF field. The transverse magnetization corresponding to the peak of the spin-echo signal can be computed from the above equation and the definition of the rotation matrices. For initial magnetization components $M_x$ and $M_y$, the final magnetization components $M_x'$ and $M_y'$ are $$M_x' = (\cos^2 \Phi \cos \Theta - \sin^2 \Phi)M_x + (\sin \Phi \cos \Phi \cos \Theta + \sin \Phi \cos \Phi)M_y \qquad (3)$$

$$M_y' = (-\sin \Phi \cos \Phi \cos \Theta - \sin \Phi \cos \Phi)M_x - (\sin^2 \Phi \cos \Theta - \cos^2 \Phi)M_y \qquad (4)$$

For an NMR imaging experiment, the magnetization precesses many cycles during a spin echo. Therefore, a good approximation to the spin-echo amplitude can be obtained by averaging Equations 3 and 4, above, over the precession angle $\Phi$; this results in $$M_x' = \tfrac{1}{2}(1 - \cos \Theta)M_x \qquad (5)$$

$$M_y' = \tfrac{1}{2}(1 - \cos \Theta)M_y \qquad (6)$$

or $$M_T' = \tfrac{1}{2}(1 - \cos \Theta)M_T \qquad (7)$$

where $M_T'$ is the magnitude of the transverse magnetization.

In contrast, the rotation matrix for a spin-echo using a composite pulse is $$R = R_z(\Phi)R_x(\Theta/2)R_y(\Theta)R_x(\Theta/2)R_z(\Phi) \qquad (8)$$

Again, averaging over $\Phi$, the transverse magnetization becomes $$M_T' = [(\sin^2 \Theta \sin^2 \Theta/2) + \tfrac{1}{4}(\cos^2 \Theta + \cos^4 \Theta/2 + \sin^4 \Theta/2 \cos^2 \Theta - 2 \sin^2 \Theta/2 \cos^2 \Theta/2 \cos \Theta - 2 \cos \Theta \cos^2 \Theta/2 + 2 \sin^2 \Theta/2 \cos^2 \Theta)]^{\tfrac{1}{2}} M_T \qquad (9)$$

Comparing Equations 7 and 9, it can be seen that the lowest order terms in Equation 9 are squared terms, whereas in Equation 7 the angle term is first order. This means that the variations, i.e., errors, in rotation angle with a composite pulse are going to be second order and, for a given inhomogeneity, are going to be significantly smaller than with a normal pulse.

Figure 5:
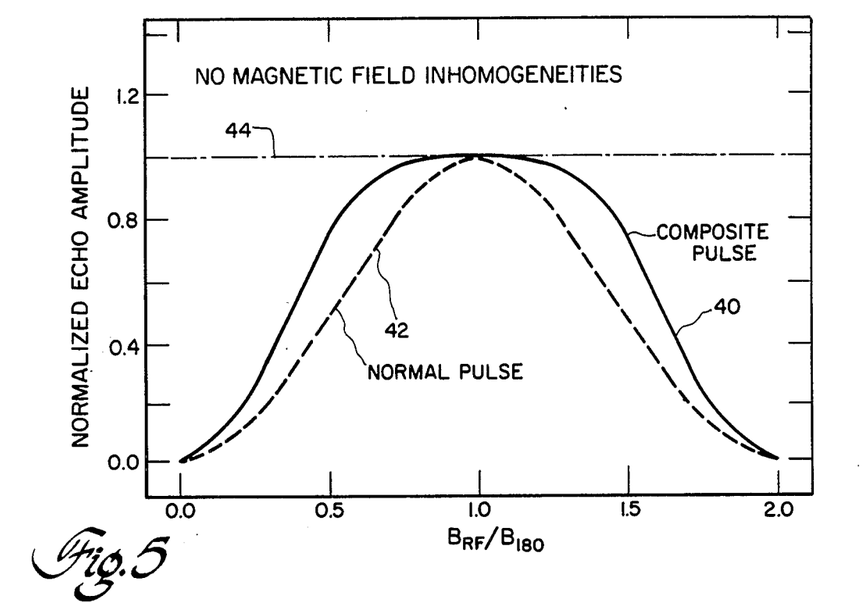
FIG. 5 illustrates the normalized echo amplitude obtainable with an imaging sequence employing a normal 180° pulse (dotted lines) and a composite 180° pulse (solid lines) as a function of the amplitude of the RF drive normalized to the amplitude of a perfect 180° pulse.

FIG. 5 compares the normalized spin-echo signal amplitude obtainable using a composite pulse (curve 40) with that obtainable using a normal pulse (curve 42) for different values of RF drive amplitude ($B_{RP}$) normalized to the amplitude of a perfect 180° pulse ($B_{180}$), in the presence of no static magnetic field inhomogeneities. Chain line 44 indicates the 1:1 normalized ratio line for comparison purposes. FIG. 5 was obtained from a computer simulation of a pulse echo experiment, and illustrates that the composite pulse (curve 40) is significantly less sensitive to variations in the magnitude of the RF field than is a normal 180° pulse (curve 42).

Figure 6A:
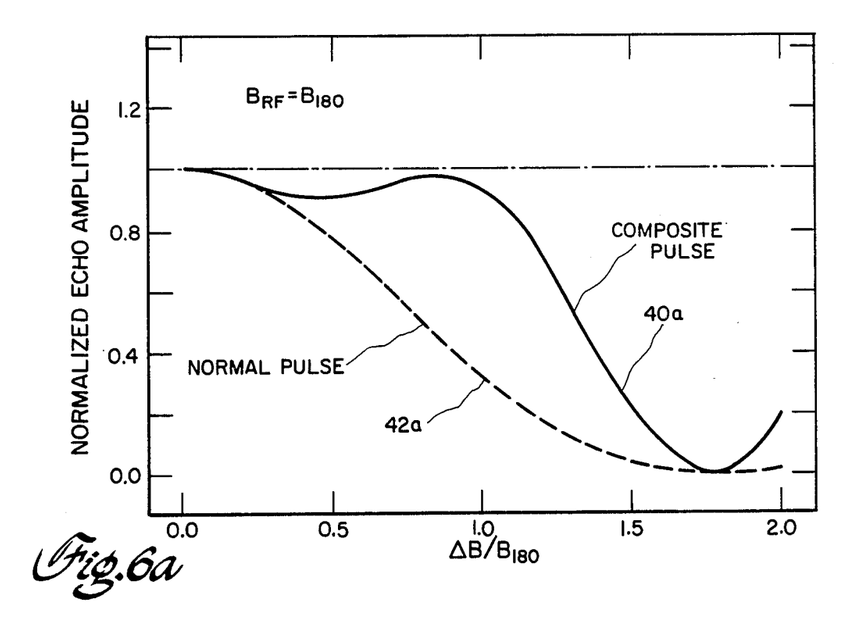
FIGS. 6a–6c illustrate, for three different levels of RF drive, the normalized echo amplitude as a function of the static magnetic field inhomogeneity normalized to the amplitude of a perfect 180° pulse.
Figure 6B:
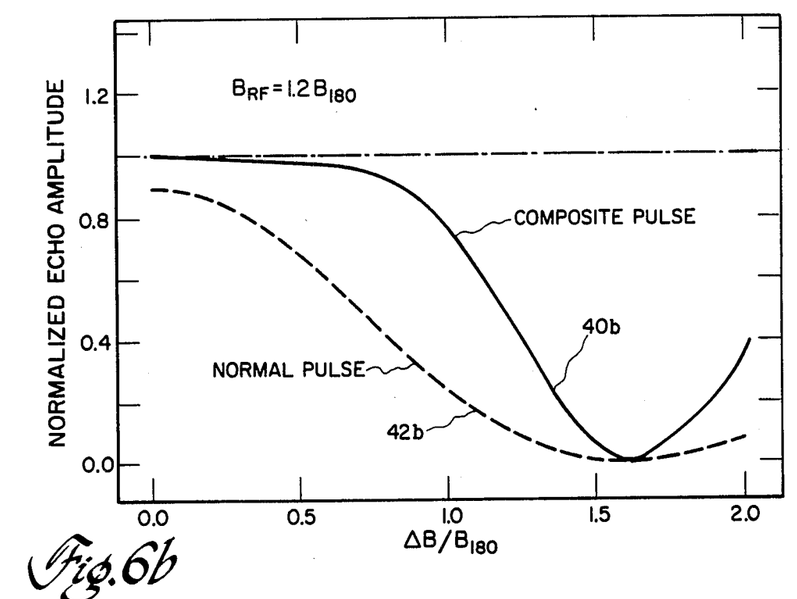
Figure 6C:
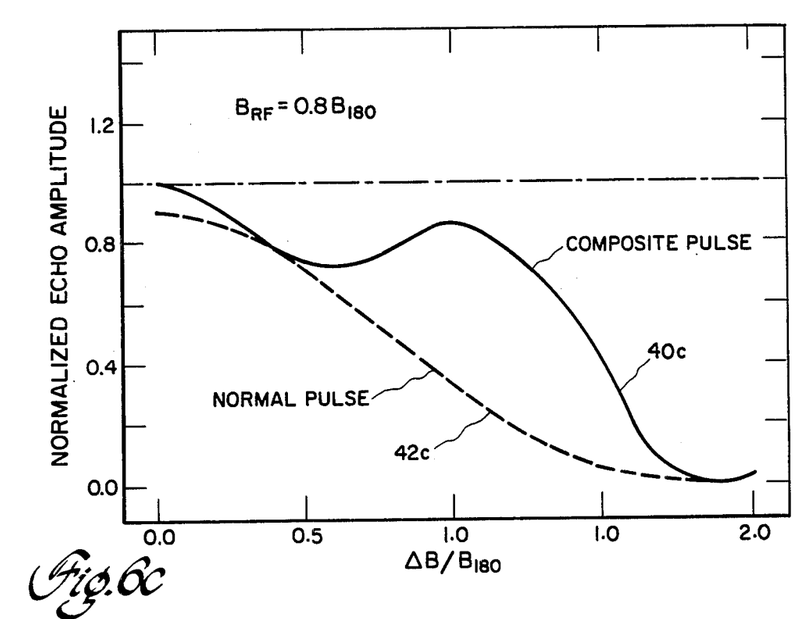

FIGS. 6a-6c were also obtained from a computer simulation and illustrate, for three different levels $B_{RF}$ of RF drive, respectively, the variation in the normalized echo amplitude as a function of static magnetic field inhomogeneity ($\Delta B$), normalized to the amplitude $B_{180}$ of a perfect 180° pulse. In each case, where the RF drive amplitude $B_{RF}$ are respectively equal to $1.0B_{180}$, $1.2B_{180}$ or $0.8B_{180}$, FIGS. 6a, 6b and 6c indicate that the composite pulse (curves 40a, 40b or 40c) is substantially less sensitive to static magnetic field inhomogeneities than is a normal 180° pulse (curves 42a, 42b or 42c). Furthermore, from the figures it can be seen that a composite pulse of only approximately one-third the amplitude of a normal pulse will produce a spin-echo signal of amplitude comparable to that produced by the normal pulse. Thus, the composite pulse can generate images with about four to five times less power. This is a very important consideration for imaging in the presence of significant magnetic field inhomogeneities.

Figure 7A:
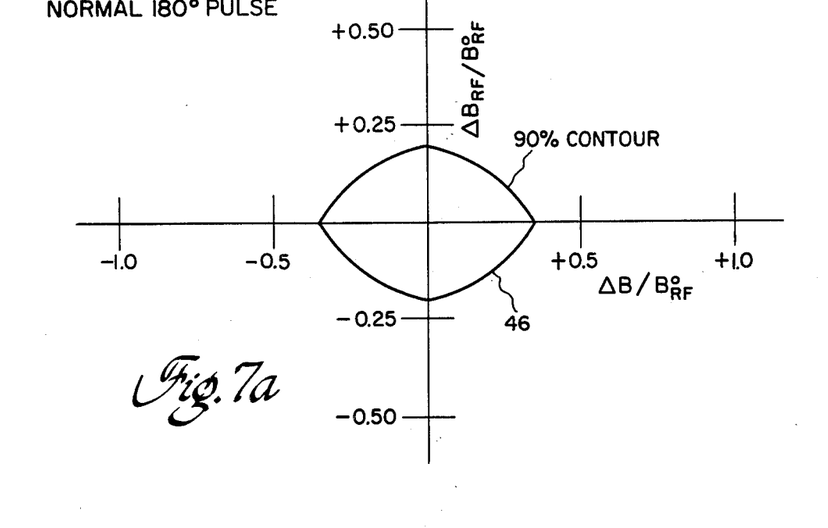
FIGS. 7a and 7b illustrate the 90% amplitude contour for a normal 180° pulse and for a composite 180° pulse, respectively, in the presence of RF magnetic field and static magnetic field inhomogeneities.
Figure 7B:
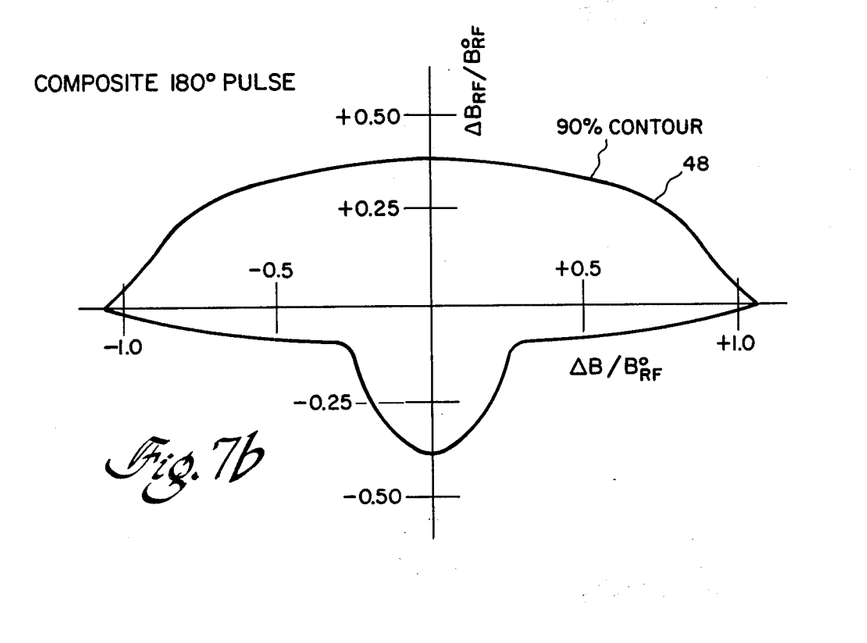

FIGS. 7a and 7b respectively illustrate the 90% amplitude contours 46 or 48 for a normal 180° pulse (FIG. 7a) and for a composite 180° pulse (FIG. 7b), respectively, in the presence of both RF field inhomogeneities ($\Delta B_{RF}$), normalized to the nominal value of the RF field for perfect time-reversal ($B°_{RF}$), and static magnetic field inhomogeneities ($\Delta B$), normalized to the nominal RF field value. FIG. 7b dramatically shows that the 90% contour 48 for the composite pulse is significantly greater than the 90% contour 46 for the normal pulse (FIG. 7a), which indicates that the composite pulse can tolerate larger inhomogeneities without loss of spin-echo signal amplitude than can a normal 180° pulse.

Although a composite pulse substantially preserves echo signal amplitude, one of the disadvantages of a composite pulse is that it introduces a phase error in the NMR signals that varies as a function of the static and RF magnetic field inhomogeneities. Thus, in NMR spectroscopy, the use of a composite pulse has been limited to applications such as inversion recovery experiments (where nuclear spins are inverted with respect to the direction of the static magnetic field and phase is not a problem) and to experiments where the magnetic field inhomogeneity is well defined. In NMR imaging where magnetic field inhomogeneities are not, in general, well defined and where rather large sample sizes are employed, it is possible to obtain rather large overall phase errors. However, in accordance with another aspect of the invention, such phase errors can be avoided and composite pulses can be advantageously employed in NMR imaging for time-reversal of nuclear spins in a transverse plane, as will now be described.

In NMR imaging, magnetic field gradients are applied to the sample so as to spatially encode the NMR signals produced by the nuclear spins. This enables the NMR signals obtained to be spatially resolved to a plurality of very small areas or points within the imaging volume with each area corresponding to at least one pixel of the NMR image. This is accomplished by Fourier-transforming the NMR signals to convert them from the time domain to the frequency domain to facilitate the separate resolution of each of the frequency components of the signal, which correspond to different pixels. Fourier-transformation of the NMR signal yields a complex signal having real and imaginary components representative of orthogonal magnetization components within the pixel. Because a pixel is quite small, the phase variation in either magnetization component across any one particular pixel is also quite small and can be neglected. However, because of the phase shift introduced by the composite pulse, if the NMR image is formed using only the real component of the frequency domain signal (which is the method normally used for formation of an NMR image), the resulting image will contain errors. In order to avoid such errors, the present method utilizes the magnitude of the complex signal, rather than simply that of the real component, in forming the NMR image. The magnitude of the complex signal is found by taking the square root of the sum of the squares of the two (real and imaginary) complex signal components, and is a straightforward processing task that may be performed readily in a well-known manner by the computer that processes the signal to generate the NMR image.

Figure 8:
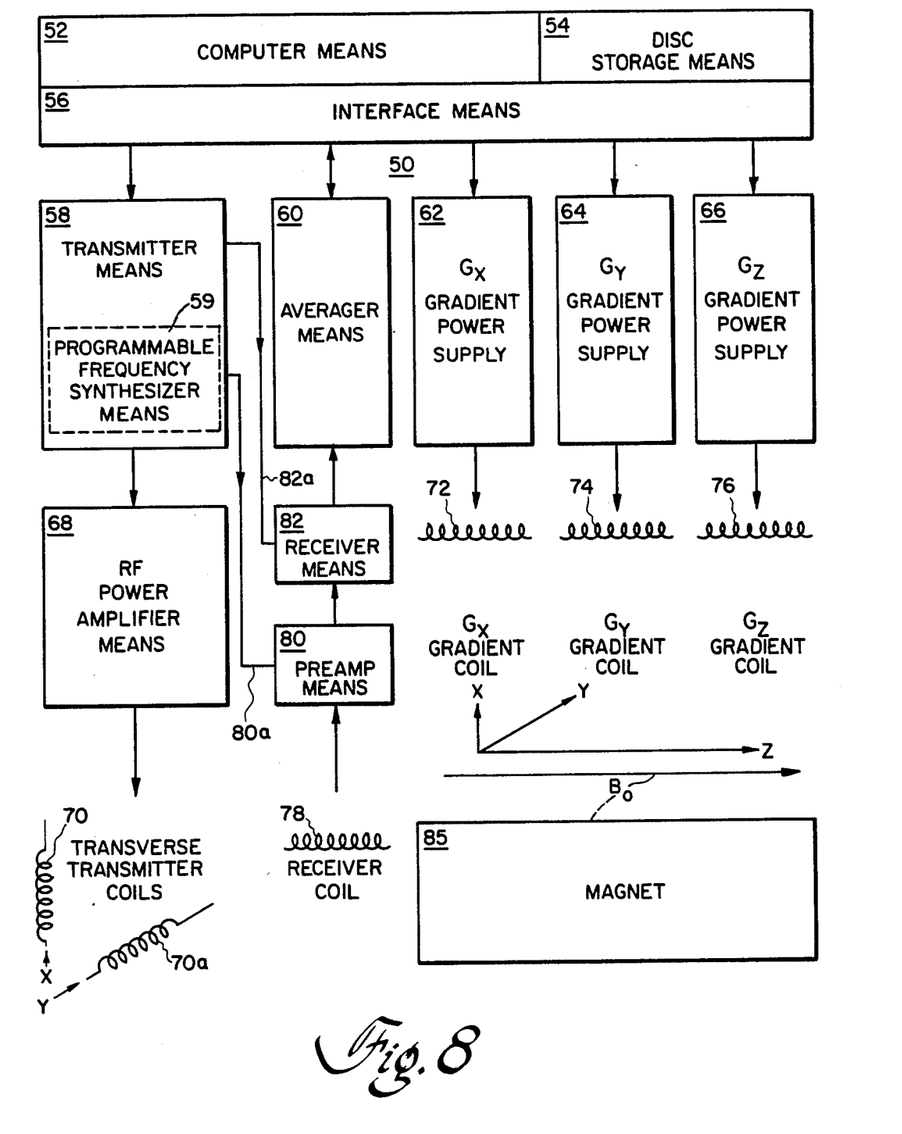
FIG. 8 is a block diagram of an NMR imaging system that may be employed to practice the invention.

FIG. 8 is a simplified block diagram of an NMR imaging system 50 which may be used for practicing the invention. The system comprises a general purpose computer means 52 coupled to a disc storage means 54 and to an interface means 56. An RF transmitter means 58, signal averager means 60 and gradient power supplies means 62, 64 and 66 for energizing, respectively x, y and z gradient coils 72, 74 and 76 may be coupled to the computer means 52 through the interface means 56. The RF transmitter means 58, which may comprise a programmable frequency synthesizer means 59 controlled by the computer, generates the RF pulses required for the imaging sequence. The pulses may be amplified in an RF power amplifier means 68 and applied to an RF transmitter coil 70. NMR signals from the sample may be received by a receiver coil 78 (which would be transmitter coil 70 switched to the receiver, for example), amplified in a low-noise preamplifier means 80 and filtered and detected by a receiver means 82. The receiver output signal may be digitized and averaged by signal averager means 60. The data from the signal averager means 60 is processed by computer 52 to construct and display the NMR image, as on a CRT display (not shown). The preamplifier means 80 and receiver means 82 may be protected from the RF pulses by gating or blanking signals from the transmitter (or from the computer), available on lines 80a and/or 82a. A magnet 85 provides the static main magnetic field $B_o$ in the z direction.

Figure 9:
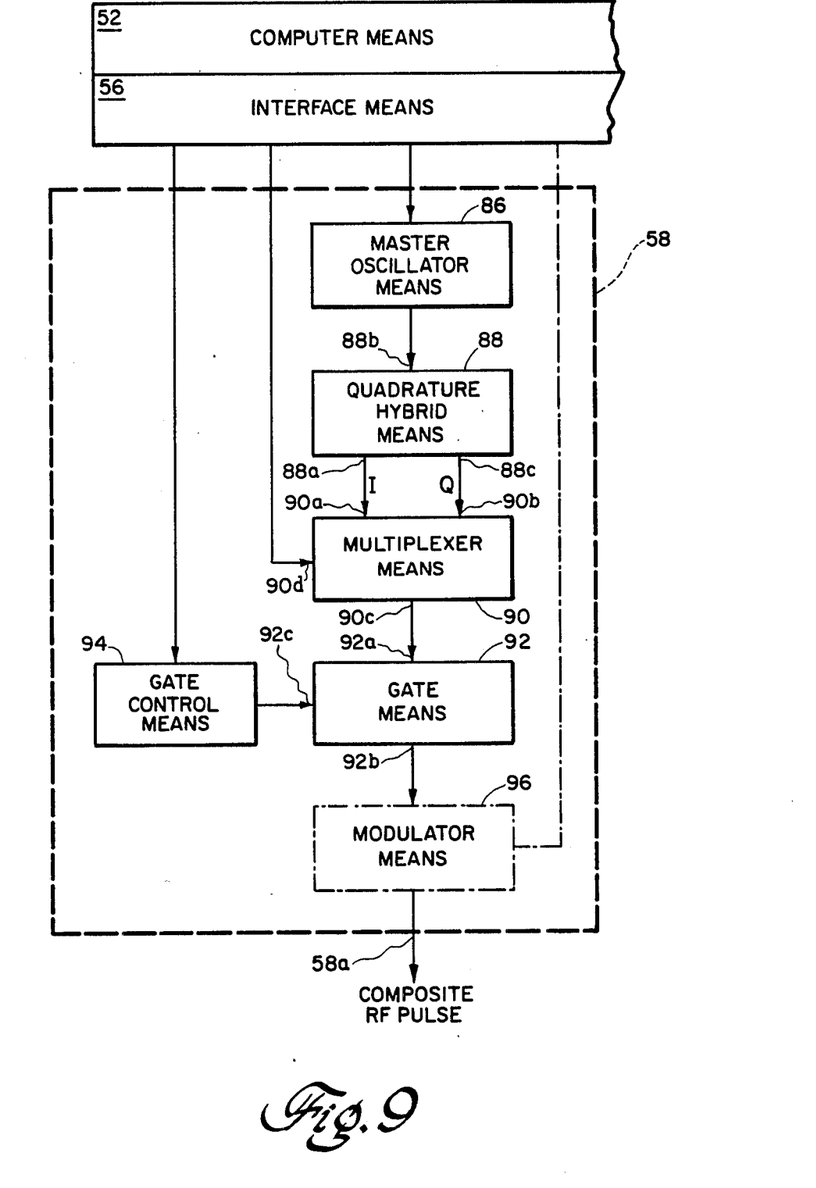
FIG. 9 is a block diagram of one presently preferred embodiment of apparatus for generating composite pulses.

To provide the orthogonal $90_x$ and $180_y$ pulses of the composite pulse, a second RF transmitter coil 70a disposed orthogonal to coil 70 may be provided, and the output of the RF power amplifier switched between the two coils by the computer. However, a preferred arrangement for generating the composite pulse using a single RF coil is illustrated in FIG. 9. As shown, RF transmitter means 58 comprises a master oscillator means 86 (which may be the programmable frequency synthesizer 59) controlled by computer means 52 through interface means 56. The output of the master oscillator is fed to a quadrature hybrid means 88 which supplies a first I signal at output 88a that is in-phase with the signal at input 88b and also supplies a second Q signal at output 88c that is phase shifted by 90° with respect to the phase of the signal at input 88b. The I and Q outputs are individually supplied to the associated one of first and second inputs 90a or 90b of a multiplexer means 90, which may comprise a single-pole, double-throw switch means and the like, having the signal at an output 90c controlled by a control signal sent to a control input 90d from the computer, to select either the I or Q outputs of the quadrature hybrid to an input 92a of a gate means 92. The amplitude of the carrier at an output 92b of gate means 92 may be controlled by a control signal at a control input 93c, which control signal can be provided by computer means 52 via a gate control circuit means 94, which may be any of the well-known gate drivers for the particular gate means selected, to cause the gate means to output an RF pulse having a predetermined duration.

In operation, master oscillator means 86 (of FIG. 9) may be set to output a frequency corresponding, for example, to the Larmor frequency of the nuclear spins at the center of the selected imaging volume. Referring to FIG. 2, at time $t_1$ corresponding to the start of time period $q_3$, the computer controls gate means 96, via gate control means 94, to open gate means 92 for a time period $q_3 = (t_4 - t_1)$ corresponding to the duration of the composite pulse. Also, at time $t_1$, corresponding to the beginning of the first $90_x$ pulse 30a, the computer controls multiplexer means 90 to select the I output from the quadrature hybrid means so that this I output is supplied via the transmitter means output 58a to the RF power amplifier means 60 and thence to the single RF coil 70. At time $t_2$, corresponding to the end of the $90_x$ pulse necessary to produce a 90° rotation of the nuclear spins about a first transverse axis, e.g., the x-axis, the computer causes multiplexer means 90 to switch to the Q output of the quadrature hybrid. Since the nuclear spins are now precessing in the transverse plane at the Larmor frequency, the 90° phase shift between the I output 38a and the Q output 88b of the quadrature hybrid means 88 corresponds to a 90° precession of the nuclear spins in the transverse plane, and the effect of switching to the phase-shifted Q output is to cause the nuclear spins to undergo a rotation about the transverse orthogonal axis, i.e., the y-axis. Thus, time $t_2$ also corresponds to the beginning of $180_y$ pulse 30b. At time $t_3$, corresponding to the end of the $180_y$ pulse 30b, the multiplexer means 90 is controlled to switch back to the I output 88a of the quadrature hybrid means 88, thereby causing the second $90_x$ pulse 30c to start and the nuclear spins to rotate about the first transverse axis. At time $t_4$, corresponding to the end of $90_x$ pulse 30c and of time period $q_3$, gate output 92b is disabled to terminate the second $90_x$ pulse 30c. Thus, the pulse sequence I-Q-I applied to a single RF coil 70 corresponds to a $90_x$-$180_y$-$90_x$ composite pulse sequence 30 which first produces a 90° rotation about the x-axis, then produces a 180° rotation about the y-axis, and finally produces a second 90° rotation about the x-axis. The same sequence may then be repeated during time periods $q_5$, $q_7$ and $q_9$ to produce successive composite pulses 30', 30'' and 30''' and to generate multiple spin-echo signals.

In some instances, it may be desirable to employ a selective, rather than a non-selective, 180° pulse to cause only the nuclear spins in a very thin slice of the imaging volume to undergo time-reversal. There are a number of problems in producing a uniform 180° rotation of nuclear spins over a thin slice of a sample, and this has represented a shortcoming in several otherwise very efficient NMR pulse imaging sequences. A composite pulse can advantageously be employed for producing a selective 180° pulse with substantially uniform rotation.

In order to time-reverse the nuclear spins only within a selected thin planar region of a sample, a $G_z$ gradient can be applied to the sample so that the Larmor frequencies of the nuclear spins within transverse planar regions of the sample vary as a function of their z-axis position. The 180° pulse can be formed such that it has frequency components restricted to a narrow band of frequencies about the Larmor frequency of the desired planar region. This can be accomplished by first generating an RF pulse having a frequency equal to the Larmor frequency, and then amplitude-modulating the RF pulse with an appropriate waveform, e.g., a Gaussian waveform, so as to restrict the frequency spectrum of the pulse to the desired range.

Figure 10:
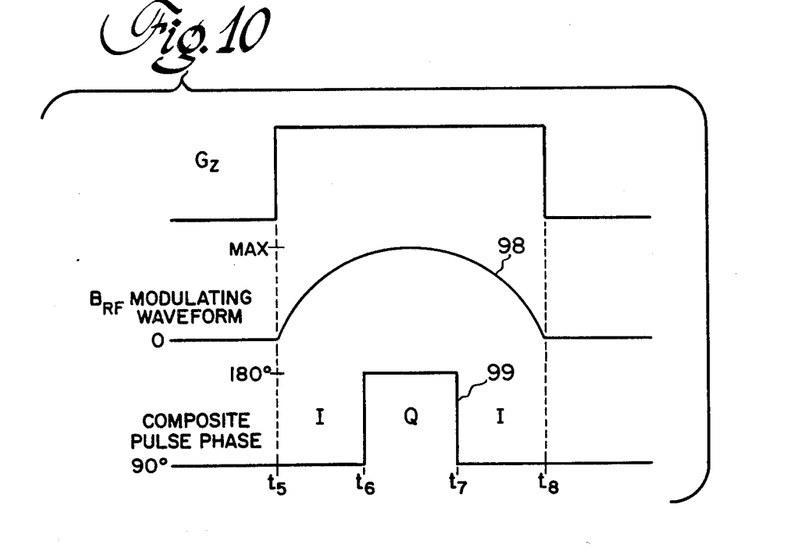
FIG. 10 is a diagrammatic view illustrating the manner in which a composite selective 180° pulse may be formed.

Referring to FIG. 10, a selective composite I-Q-I pulse sequence can be formed in a manner similar to that described for the non-selective component pulse using the apparatus of FIG. 9. The composite pulse at gate means output 92b is then amplitude-modulated by an appropriate waveform 98 (such as the Gaussian waveform 98 shown, for example, in FIG. 10) selected to restrict the frequency components of the pulse to the desired range. The modulation waveform 98 can be generated by computer means 52 and applied to the composite pulse by a modulator means 96 (shown in phantom lines in FIG. 9) disposed between the gate means output 92 and the transmitter means output 58a. Alternatively, gate means 92 may be a gated modulator means that applies both the modulation waveform, gated to be present only between times $t_5$ and $t_8$, to the composite pulse. The amplitude-modulated composite pulse (having the amplitude envelope of waveform 98 and the phase relationships of curve 99) is then applied to the sample in the presence of a gradient $V_z$, as shown in the figure, so as to rotate the spins in the selected thin planar slice.

In order for the I and Q components of the composite pulse to provide respective 90° and 180° rotations of the nuclear spins, it is necessary to adjust the pulse durations of the I pulses ($t_6-t_5$ and $t_8-t_7$) and the duration of the Q pulse ($t_7-t_6$) such that $$\pi/2 = \int_{t_5}^{t_6} \gamma B_{RF}(t)dt = \int_{t_7}^{t_8} \gamma B_{RF}(t)dt \qquad (10)$$

and $$\pi = \int_{t_6}^{t_7} \gamma B_{RF}(t)dt \qquad (11)$$

where $B_{RF}(t)$ is the RF magnetic field produced by the amplitude-modulated pulse having amplitude envelope 98.

While a preferred embodiment of the invention has been shown and described, it will be apparent to those skilled in the art that many modifications and variations can be made in this embodiment without departing from the principles and spirit of the invention, the scope of which is defined in the appending claims.

What is claimed is:

1. A method for providing an NMR image of a sample, comprising the steps of:
    (a) applying to the sample an NMR imaging sequence which includes the step of applying to the sample a composite pulse which is formed of a sequence of a plurality of pulses each for producing an associated one of a plurality of rotations of the nuclear spins about substantially orthogonal axes in a selected transverse planar region to cause the nuclear spins to be time-reversed;
    (b) detecting the resulting spin-echo NMR signals produced, responsive to the imaging sequence, by the nuclear spins at a plurality of different locations in the selected transverse planar region;
    (c) processing the resulting detected spin-echo NMR signals to produce complex signals; and
    (d) forming the NMR image using the magnitudes of the complex signals.

2. The method of claim 1, wherein the composite pulse applying step comprises the steps of: applying a first pulse to produce a first rotation of the nuclear spins about a first axis in the transverse planar region; then applying a second pulse, following the first pulse, to produce a second rotation of the nuclear spins about a second axis in the transverse planar region and substantially orthogonal to the first axis; and thereafter applying a third pulse, following the second pulse, to produce a third rotation of the nuclear spins about the first axis.

3. The method of claim 2, including the steps of: forming the first and third pulses to produce substantially a 90° rotation about the first axis; and forming the second pulse to produce substantially a 180° rotation about the second axis.

4. The method of claim 3, further comprising the steps of: providing each of the first, second and third pulses at substantially the same amplitude; and providing the second pulse with a duration that is twice the duration of each of the first and third pulses.

5. The method of claim 2, further comprising the step of applying all three of the pulses of the pulse sequence along only one selected one of the first and second axes.

6. The method of claim 5, further comprising the step of providing each of the three pulses as a gated RF pulse.

7. The method of claim 6, further comprising the steps of: applying the second pulse immediately following the end of the first pulse; applying the third pulse immediately following the end of the second pulse; and providing a substantially 90° phase difference between each of the first and second pulses and between each of the second and third pulses.

8. The method of claim 7, further comprising the step of deriving said pulses from an RF source that produces in-phase and quadrature-phase RF outputs, the first pulse being derived from one of said outputs and the second pulse being derived from the other of said outputs.

9. The method of claim 1, wherein step (c) includes the steps of: Fourier-transforming the detected spin-echo NMR signals to produce complex signals having real and imaginary components; and wherein step (d) includes the step of deriving the magnitude of each of the complex signals from both the real and imaginary components of that complex signal.

10. The method of claim 1, further comprising the step of applying a plurality of successive composite pulses to the sample to successively time-reverse the nuclear spins and generate at least one of a sequence of multiple spin-echo signals responsive to each composite pulse.

11. The method of claim 1, further comprising the step of providing the composite pulse as a selective 180° pulse to rotate substantially by 180° only the nuclear spins in a selected thin planar slice of the sample.

12. The method of claim 11, wherein the selective 180° pulse is provided by the steps of: selecting the RF carrier frequency to excite the nuclear spins in the thin planar slice; selecting a sequence of in-phase and quadrature-phase components of the RF carrier; and amplitude-modulating the selected-phase-sequenced RF carrier with a modulation envelope selected to confine the frequency spectrum of the pulse to a narrow band of frequencies about the selected RF carrier frequency.

13. A composite RF pulse generator, for NMR imaging apparatus in which an imaging signal sequence is applied to a sample and NMR response signals are detected to form an NMR image of a selected transverse planar region of the sample, said generator being used for time-reversing nuclear spins in the selected transverse planar region, comprising:
    RF source means for generating an RF carrier having a selected frequency substantially at the NMR frequency of the desired nuclear spins in the selected region;

means connected to the RF source for producing in-phase and quadrature-phase components of the RF carrier;

means for combining the in-phase and quadrature-phase components of said RF carrier into at least one composite RF carrier pulse which, when applied to said sample, each sequentially produce a first rotation of the nuclear spins in the selected region about a first transverse axis, a second rotation of the nuclear spins about a second transverse axis substantially orthogonal to the first axis, and a third rotation of the spins about the first axis so as to time-reverse the nuclear spins;

means, receiving said composite pulse from said combining means, for modulating the amplitude of the envelope of the composite RF pulse to confine the frequency spectrum of the modulated composite RF pulse to a selected narrow band of frequency substantially about said NMR frequency; and means coupled to said modulating means for applying the modulated composite RF pulse to the sample.

14. The apparatus of claim 13, wherein said applying means comprises means for applying the composite RF pulse to the sample along a selected one of said first and second transverse axes.

15. The apparatus of claim 13, wherein the first and third rotations are substantially 90°, and the second rotation is substantially 180°.

16. The apparatus of claim 15, wherein the composite RF pulse comprises a first in-phase pulse, a second quadrature-phase pulse immediately following the first pulse, and a third in-phase pulse immediately following the second pulse.

17. The apparatus of claim 16, further comprising means for controlling the durations of each of the respective first, second and third pulses to produce said respective rotations therewith.

18. The apparatus of claim 13, further comprising: means for processing the NMR signals received from said sample to produce complex signals having real and imaginary components; and means for forming the NMR image from the magnitude of said complex signals.

19. The apparatus of claim 18, wherein said received NMR signals comprise spin-echo signals, and further comprising: means for generating a successive sequence of composite RF pulses; and means for applying said sequence of composite pulses to the sample as part of the imaging sequence to produce multiple spin echo received signals.

* * * * *